United States Patent
Sato (10) Patent No.: US 10,755,957 B2
(45) Date of Patent: Aug. 25, 2020

(54) MEASUREMENT METHOD, METHOD OF REMOVING STATIC ELECTRICITY, AND PLASMA PROCESSING APPARATUS

(71) Applicant: Tokyo Electron Limited, Tokyo (JP)

(72) Inventor: Masanori Sato, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 273 days.

(21) Appl. No.: 15/844,729

(22) Filed: Dec. 18, 2017

(65) Prior Publication Data
US 2018/0182656 A1    Jun. 28, 2018

(30) Foreign Application Priority Data
Dec. 26, 2016  (JP) .................................. 2016-251572

(51) Int. Cl.
*H01L 21/683*   (2006.01)
*H01J 37/02*    (2006.01)
(Continued)

(52) U.S. Cl.
CPC ........ *H01L 21/6833* (2013.01); *H01J 37/026* (2013.01); *H01J 37/32009* (2013.01);
(Continued)

(58) Field of Classification Search
CPC .... G01R 29/12; G01R 29/02; G01R 29/0878; G01R 29/0885; G01R 29/14; G03F 7/70708; H01J 37/026; H01J 37/32; H01J 37/32009; H01J 37/32568; H01J 37/32706; H01J 37/32715; H01J 37/32935; H01L 21/3065; H01L 21/67109; H01L 21/683; H01L 21/6831; H01L 21/6833; H01L 22/14; H01L 22/30; H01L 21/68742; H01L 21/6875; H01L 21/68757; H01L 21/68764; H01L 21/68771; H01L 21/68778;
(Continued)

(56) References Cited

U.S. PATENT DOCUMENTS 5,325,261 A * 6/1994 Horwitz ................. H02N 13/00
                                                 361/230
5,818,682 A * 10/1998 Loo ..................... H01L 21/6831
                                                 361/234
(Continued)

FOREIGN PATENT DOCUMENTS

| JP | 11330217 A | * | 11/1999 |
| JP | 2007165917 A | * | 6/2007 |
| JP | 2008294257 A | * | 12/2008 |
| JP | 2013-161899 | | 8/2013 |

*Primary Examiner* — Jared Fureman
*Assistant Examiner* — Nicolas Bellido
(74) *Attorney, Agent, or Firm* — IPUSA, PLLC (57) ABSTRACT

A measurement method includes vibrating a wafer through up-and-down movement of one or more pins supporting the wafer after performing processing with gas-based plasma generated through application of high-frequency electric power while the wafer, which is placed on a stage in a processing container, is electrostatically adhered by an electro-static chuck, calculating a residual charge amount of the wafer from an induced current flowing through an attracting electrode upon the vibrating of the wafer, and calculating a voltage to be applied to the attracting electrode in response to the calculated residual charge amount of the wafer.

10 Claims, 10 Drawing Sheets

(51) Int. Cl.
*H01J 37/32* (2006.01)
*H01L 21/66* (2006.01)
*G01R 29/12* (2006.01)

(52) U.S. Cl.
CPC .. *H01J 37/32568* (2013.01); *H01J 37/32706* (2013.01); *H01J 37/32715* (2013.01); *H01J 37/32935* (2013.01); *H01L 22/14* (2013.01); *H01L 22/30* (2013.01); *G01R 29/12* (2013.01)

(58) Field of Classification Search
CPC ......... H01L 21/68785; H01L 21/68792; H01T 23/00; H02N 13/00; H05F 3/00; H05F 3/02; H05F 3/04; H05H 1/46; H05K 9/0067
See application file for complete search history.

(56) References Cited

U.S. PATENT DOCUMENTS

| | | | | |
|---|---|---|---|---|
| 9,466,519 B2* | 10/2016 | Kawabata | ........... | H01L 21/6833 |
| 2004/0182311 A1* | 9/2004 | Hanazaki | .......... | H01L 21/67288 |
| | | | | 118/663 |
| 2006/0238953 A1* | 10/2006 | Hanawa | ............... | H01L 21/6831 |
| | | | | 361/234 |
| 2010/0271744 A1* | 10/2010 | Ni | ....................... | H01L 21/6833 |
| | | | | 361/233 |
| 2013/0153147 A1* | 6/2013 | Senzaki | ................ | H02N 13/00 |
| | | | | 156/345.26 |
| 2015/0132967 A1* | 5/2015 | Urakawa | ........... | H01L 21/67109 |
| | | | | 438/714 |
| 2015/0181683 A1* | 6/2015 | Singh | .................. | H01L 21/6833 |
| | | | | 361/234 |
| 2015/0303092 A1* | 10/2015 | Kawabata | ........... | H01L 21/6833 |
| | | | | 361/234 |

* cited by examiner

| RESIDUAL CHARGE / SURFACE CHARGE POTENTIAL | RESIDUAL ADHESION NOT INVOLVING DIELECTRIC LAYER (IDEAL) | RESIDUAL ADHESION INVOLVING DIELECTRIC LAYER (ESTIMATE) |
|---|---|---|
| 50 V | 0.6 [μC] | 0.5 [μC] |
| 100 V | 1.3 [μC] | 1.1 [μC] |

MEASUREMENT METHOD, METHOD OF REMOVING STATIC ELECTRICITY, AND PLASMA PROCESSING APPARATUS

BACKGROUND OF THE INVENTION

1. Field of the Invention

The disclosures herein generally relate to a measurement method, a method of removing static electricity, and a plasma processing apparatus.

2. Description of the Related Art

Repeating a plasma process multiple times causes residual charge to be accumulated on the surface of an electro-static chuck. Reaction products formed by plasma processes are deposited on the surface of an electro-static chuck, ending up affecting the surface over time. An insulating film formed by such deposited materials on the surface stores charge, which creates a residual charge. The surface of the electro-static chuck is charged in this manner, and the residual charge generates an attractive force with respect to a wafer. Due to this attractive force, a wafer may be broken or sent flying when the wafer is raised by a pin exerting an upward force.

Residual charge on the surface of an electro-static chuck is not removable by a process of removing static electricity. Patent Document 1 discloses measuring the amount of charge accumulated in an electrode (which will hereinafter be referred to as an "attracting electrode") of an electrostatic chuck in an initial state in which no residual charge is present on the surface of the electro-static chuck. A change in the amount of charge caused by the build-up of charge is calculated from an electric current flowing upon the power-off of the electro-static chuck, followed by determining the residual charge based on the difference.

The amount of residual charge on the surface of an electro-static chuck differs from wafer to wafer, and also varies depending on the usage conditions, usage history, and process conditions of the electro-static chuck. It is thus difficult to identify the exact condition for removing static electricity suitable for the amount of residual charge at the timing of disengaging a wafer from an electro-static chuck. There is also a need to measure the amount of residual charge affecting a wafer before disengaging the wafer from an electro-static chuck in order to avoid damaging the wafer.

Accordingly, there may be a need to estimate the amount of residual charge of a wafer before disengaging the wafer from an electro-static chuck.

RELATED-ART DOCUMENTS

Patent Document

[Patent Document 1] Japanese Patent Application Publication No. 2013-161899

SUMMARY OF THE INVENTION

It is a general object of the present invention to provide a measurement method, a method of removing static electricity, and a plasma processing apparatus that substantially obviate one or more problems caused by the limitations and disadvantages of the related art.

According to an embodiment, a measurement method includes vibrating a wafer through up-and-down movement of one or more pins supporting the wafer after performing processing with gas-based plasma generated through application of high-frequency electric power while the wafer, which is placed on a stage in a processing container, is electrostatically adhered by an electro-static chuck, calculating a residual charge amount of the wafer from an induced current flowing through an attracting electrode upon the vibrating of the wafer, and calculating a voltage to be applied to the attracting electrode in response to the calculated residual charge amount of the wafer.

According to an embodiment, a method of removing static electricity includes vibrating a wafer through up-and-down movement of one or more pins supporting the wafer after performing processing with gas-based plasma generated through application of high-frequency electric power while the wafer, which is placed on a stage in a processing container, is electrostatically adhered by an electro-static chuck, calculating a residual charge amount of the wafer from an induced current flowing through an attracting electrode upon the vibrating of the wafer, calculating a voltage to be applied to the attracting electrode in response to the calculated residual charge amount of the wafer, applying the calculated voltage to the attracting electrode and then stopping the application of high-frequency electric power after, and stopping applying the calculated voltage to the attracting electrode after stopping the application of high-frequency electric power.

According to an embodiment, a plasma processing apparatus for processing a wafer with gas-based plasma generated through application of high-frequency electric power while the wafer, which is placed on a stage in a processing container, is electrostatically adhered by an electro-static chuck includes a control unit configured to control the plasma processing apparatus, wherein the control unit is configured to vibrate the wafer through up-and-down movement of one or more pins supporting the wafer after performing processing with the plasma, to calculate a residual charge amount of the wafer from an induced current flowing through an attracting electrode upon the vibrating of the wafer, and to calculate a voltage to be applied to the attracting electrode in response to the calculated residual charge amount of the wafer.

According to at least one embodiment, the amount of residual charge of a wafer is estimated before disengaging the wafer from an electro-static chuck.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments for carrying out the invention will be described by referring to the accompanying drawings. In the specification and drawings, elements having substantially the same configurations are referred to by the same numerals, and a duplicate description thereof will be omitted.

[Overall Configuration of Plasma Processing Apparatus]

In the following, an example of a plasma processing apparatus 1 will be described by referring to FIG. 1. The plasma processing apparatus 1 of the present embodiment, which is a parallel-plate plasma processing apparatus of a capacitive coupling type, includes a processing container 10 that is a substantially cylindrical shape. The inner surface of the processing container 10 has been subjected to an alumite treatment (i.e., anodization). The inner space of the processing container 10 is a processing chamber in which plasma processes for etching, film deposition, and the like are performed.

A stage 20 is configured to have a wafer W disposed thereon that is an example of a substrate. The stage 20 may be made of aluminum (Al), titanium (Ti), silicon carbide (SiC), or the like. The stage 20 also serves as a lower electrode.

The stage 20 has an electro-static chuck 22 for electrostatically attracting the wafer W. The structure of the electro-static chuck 22 includes a dielectric base 24 and an attracting electrode 23 embedded therein. The attracting electrode 23 is coupled to a DC power supply 36 through a switch 37. Applying a DC voltage HV from the DC power supply 36 to the attracting electrode 23 causes the wafer W to be attracted to the electro-static chuck 22 through a Coulomb force.

The upper face of the electro-static chuck 22 has, along the outer periphery thereof, an annular focus ring 25 around the outer edge of the wafer W. The annular focus ring 25, which may be made of silicon, for example, serves to converge plasma toward the surface of the wafer W so as to improve the efficiency of plasma processing.

The stage 20 is supported by a support structure 21. With this arrangement, the stage 20 is held steady at the bottom of the processing container 10. The support structure 21 may have a coolant pathway formed therein. Heat transfer gas may be supplied to the back face of the wafer W. Circulating coolant through the coolant pathway and supplying heat transfer gas to the back face of the wafer W serve to control the temperature of the wafer W.

The stage 20 receives high-frequency power HF having a first frequency for generating plasma from a first high-frequency power supply 32. The stage 20 also receives high-frequency power LF having a second frequency lower than the first frequency for generating a bias voltage from a second high-frequency power supply 34. The first high-frequency power supply 32 is electrically coupled to the stage 20 through a first matching box 33. The second high-frequency power supply 34 is electrically coupled to the stage 20 through a second matching box 35. The first high-frequency power supply 32 may apply 40-MHz high-frequency power HF, for example, to the stage 20. The second high-frequency power supply 34 may apply 13.56-MHz high-frequency power LF, for example, to the stage 20. Although the first high-frequency power is applied to the stage 20 in the present embodiment, the first high-frequency power may alternatively be applied to a gas showerhead 40.

The first matching box 33 matches the load impedance to the internal (i.e., output) impedance of the first high-frequency power supply 32. The second matching box 35 matches the load impedance to the internal (i.e., output) impedance of the second high-frequency power supply 34.

The gas showerhead 40 is disposed to close an upper-face opening of the processing container 10 with a shield ring 11 intervening therebetween for covering the outer edge of the gas showerhead 40. The gas showerhead 40 is coupled to the ground. The gas showerhead 40 may be made of silicon. The gas showerhead 40 also serves as an opposing electrode (i.e., upper electrode) that faces the stage 20 (i.e., lower electrode).

The gas showerhead 40 has a gas inlet 41 into which gas is injected. The gas showerhead 40 has a spreading chamber 42 formed therein for spreading the gas. Gas supplied from a gas supply 50 enters the spreading chamber 42 through the gas inlet 41 to be spread and introduced into the inner space of the processing container 10 through a large number of gas supply holes 43.

An exhaust port 60 is formed at the bottom of the processing container 10. An exhaust device coupled to the exhaust port 60 exhausts gasses inside the processing container 10. This arrangement serves to maintain a predetermined vacuum condition inside the processing container 10. The sidewall of the processing container 10 has a gate valve G formed thereon. The gate valve G is opened and closed when loading and unloading the wafer W to and from the processing container 10.

The plasma processing apparatus 1 is provided with a control unit 100 for controlling the operation of the apparatus. The control unit 100 includes a CPU (central processing unit) 105, a ROM (read only memory) 110, and a ram (random access memory) 115. The CPU 105 performs requested processes such as etching in accordance with the recipes stored in the memory space of the RAM 115 or the like. The recipes specify a processing time, a pressure (gas exhaustion), a high-frequency power or voltage, the amount of circulating gasses, temperature inside the processing container (i.e., the temperature of the upper electrode, the temperature of the sidewall of the processing container, the temperature of a wafer W, the temperature of the electro-static chuck, etc.), the temperature of coolant, and the like, which are the information for controlling the apparatus in accordance with process conditions. These recipes indicative of programs and process conditions may alternatively be stored in a hard disk drive or a semiconductor memory. The recipes may alternatively be stored in a portable computer-readable recording medium such as a CD-ROM, DVD, or the like, and may be loaded to the apparatus for retrieval.

The opening and closing of the gate valve G are controlled at the time of loading a wafer. As the wafer W is loaded to the processing container 10, the wafer W is transferred from the arm to support pins 90. The number of support pins 90 may be three, for example. The support pins 90 are disposed such as to penetrate all the way through the stage 20 to support the wafer W.

The support pins 90 are driven by a pin driver 82 to move up and down. After the wafer W is placed onto the stage 20 by the downward movement of the support pins 90, the DC power supply 36 applies a DC voltage HV to the attracting electrode 23, so that the wafer W is attracted to and held steady by the electro-static chuck 22.

The gas supply 50 then supplies a process gas to the inner space of the processing container 10. The first high-frequency power supply 32 applies a first high-frequency power to the stage 20, and the second high-frequency power supply 34 applies a second high-frequency power to the stage 20. With this arrangement, a predetermined plasma treatment is performed with respect to the wafer W through the function of plasma generated over the wafer W and through the attracting of ions.

After the plasma treatment, the DC power supply 36 applies, to the attracting electrode 23, a DC voltage having a reversed polarity relative to the voltage applied at the time of attracting the wafer W, or a DC voltage derived as will be described later, thereby removing charge from the wafer W. With this arrangement, the wafer W is disengaged from the electro-static chuck 22 and unloaded to the outside of the processing container through the gate valve G. Subsequently, a next wafer W is loaded, subjected to a plasma treatment, and unloaded.

[Electrostatically Induced Current]

In the present embodiment, the wafer W is vertically vibrated before the disengagement of the wafer W. In this state, electrically induced current (which will hereinafter be referred to as "induced current") generated in the attracting electrode 23 is amplified by a current amplifier 81 for provision to a phase sensitive detector 80. The phase sensitive detector 80 produces a DC current corresponding to the induced current.

When the wafer W is to be unloaded after the plasma treatment performed with respect to the wafer W, the wafer W has charge stored therein due to the effect of residual charge in the surface of the electro-static chuck 22. The pins are moved up and down in this state according to the present embodiment. A signal (which will hereinafter be referred to as a "reference signal") for moving the pins up and down is controlled by control unit 100 and applied to the pin driver 82. The pin driver 82 drives the support pins 90 in response to the reference signal, thereby effecting the movement.

As will be described later, the amplitude of the reference signal is equivalent in distance to 1 mm or smaller, and is preferably equivalent in distance to 0.5 mm or smaller. The frequency of the reference signal is preferably greater than or equal to 1 Hz and smaller than or equal to 10 Hz.

Figure 2:
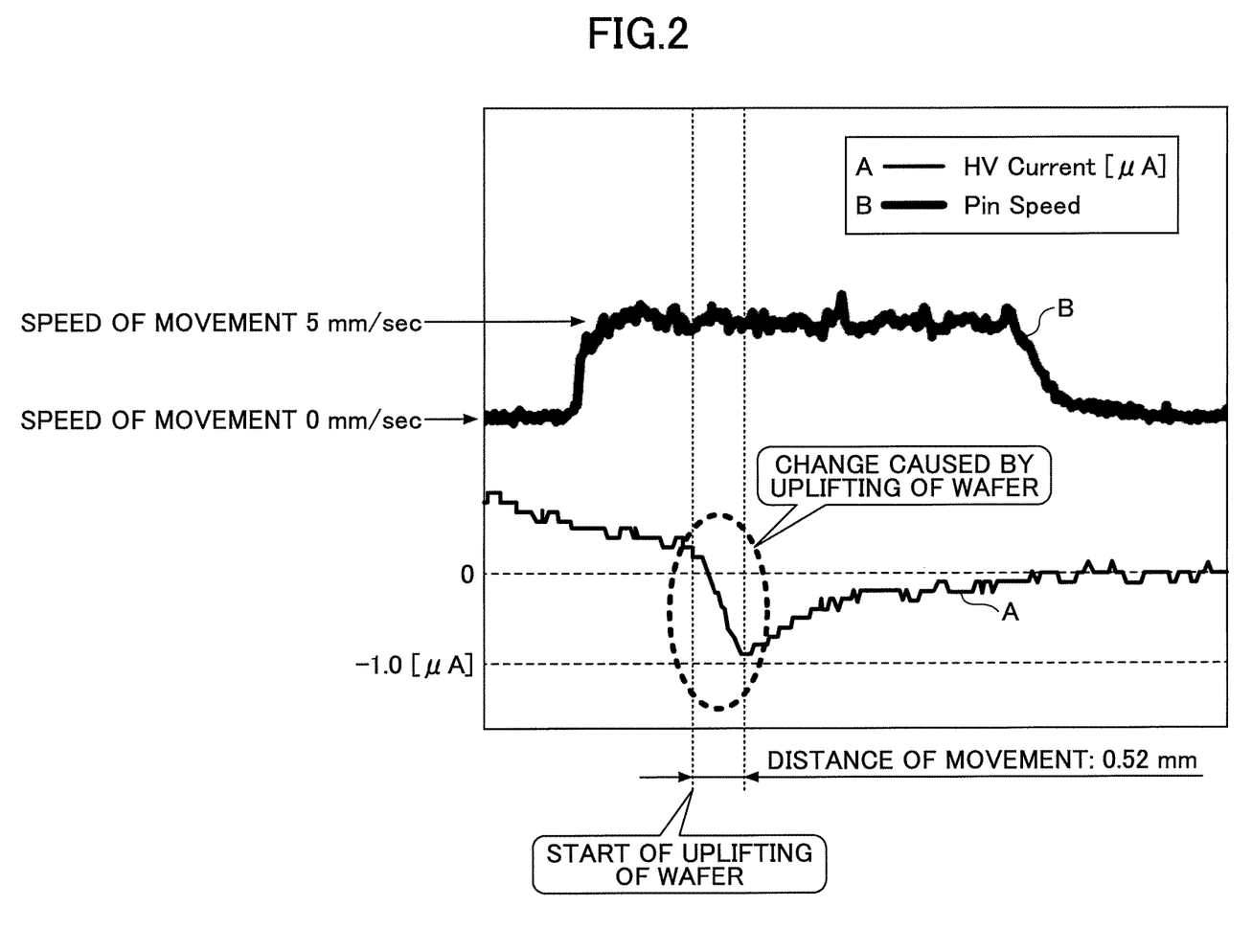
FIG. 2 is a drawing illustrating an example of induced current generated by a displacement of a wafer according to the embodiment.

The movement of the support pins 90 causes the wafer W to be displaced, which creates the flow of induced current. In FIG. 2, a line B represents the speed of movement of the support pins 90, and a line A represents induced current generated in response to the movement of the support pins 90. As the speed of movement of the support pins 90 changes from 0 mm/sec to 5 mm/sec to start raising the wafer W, induced current responsive to the displacement of the wafer W starts flowing, resulting in the flow of an induced current of approximately −1.0 microamperes at the maximum. Whether the polarity of induced current is negative or positive depends on the polarity of charge stored in the wafer W.

Figure 3A:
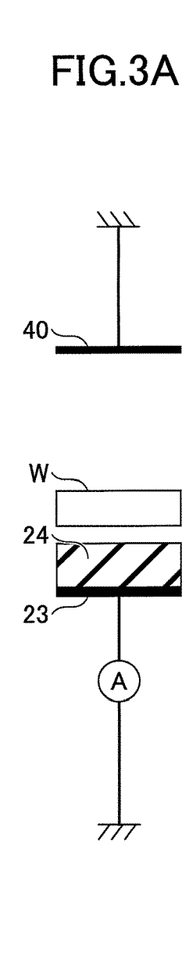
FIG. 3A is a drawing illustrating an example of an equivalent circuit of the apparatus.

When this happens, induced current flows through every electrode that faces the wafer W. Namely, the induced current flows through the attracting electrode 23, the gas showerhead 40, and the inner wall of processing container 10. FIG. 2 illustrates the measurement of induced current generated in the attracting electrode 23. In the present embodiment, an ammeter A is connected to the attracting electrode 23 as illustrated in FIG. 3A to measure induced current.

Figure 3B:
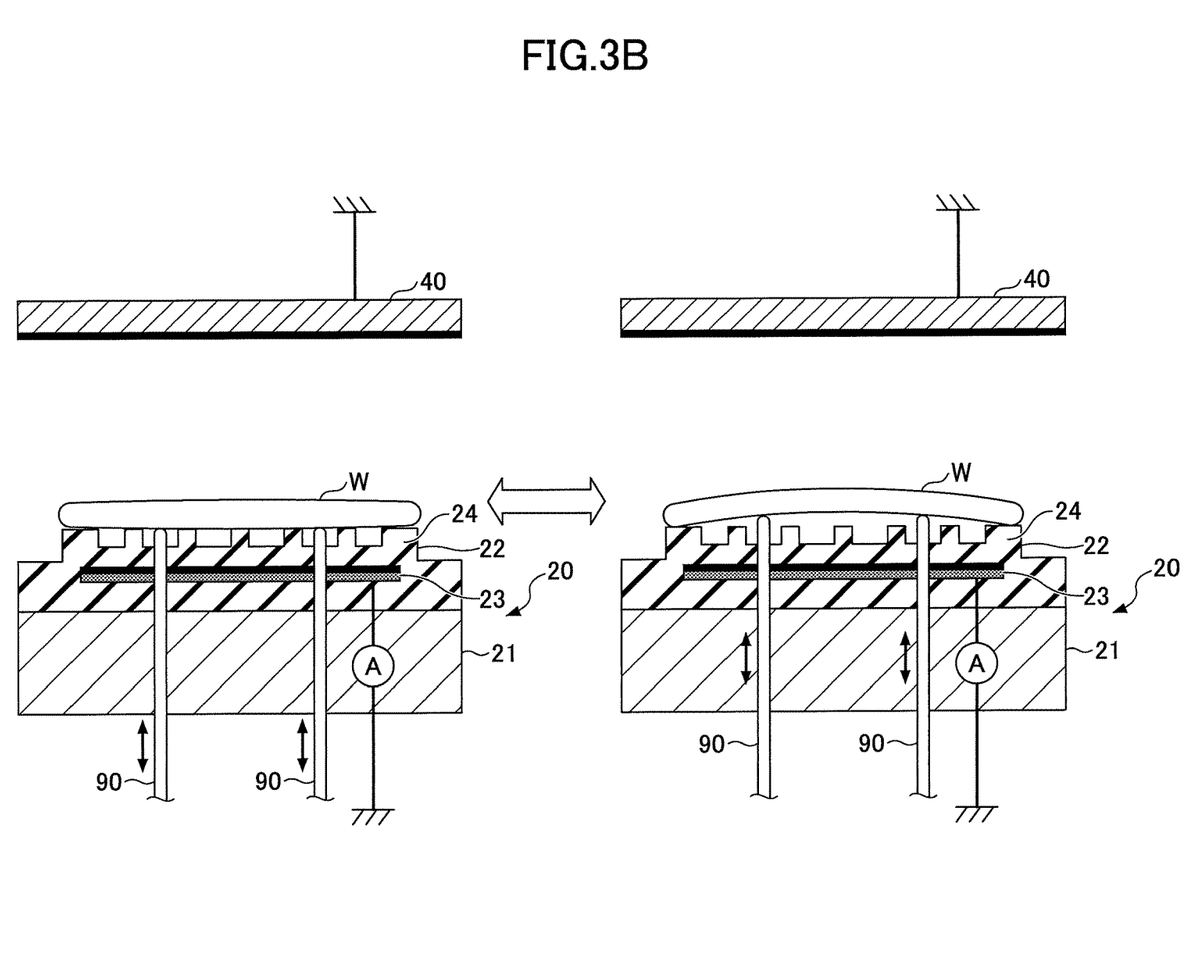
FIG. 3B is a drawing illustrating a model of the apparatus used to measure residual charge.

In the example illustrated in FIG. 2, the distance of movement of the support pins 90 is 0.52 mm. Namely, the vertical movement of the support pins 90 causes the wafer W to be displaced approximately 0.52 mm. The drawing on the left-hand side in FIG. 3B illustrates the wafer W placed on the stage 20. The drawing on the right-hand side in FIG. 3B illustrates the wafer W that is raised approximately 0.52 mm from the stage 20 by the support pins 90. The wafer W is not fully separated from the electro-static chuck 22, and is slightly raised by the upward movement of the support pins 90 while part of the wafer W remains attached to the electro-static chuck 22 due to residual adherence.

[Phase Sensitive Detection]

Induced current and leak current have a 90-degree displacement with each other. The phase sensitive detector 80 produces a DC current corresponding to the induced current separately from the leak current.

Measuring the potentials of metal electrodes by use of the Kelvin method is directed to the system formed between two electrodes having respective potentials, e.g., the system in which both electrodes (bipolar) are directly coupled to a power supply as in the case of a capacitor. In contrast, the wafer W in the plasma processing apparatus 1 of the present embodiment is a floating electrode whose potential cannot be determined, so that only the attracting electrode 23 under monopole conditions is available for potential measurement. In the plasma processing apparatus 1 of the present embodiment, thus, the potential of the attracting electrode 23 (monopole) cannot be determined by use of the Kelvin method. There is thus a need in the present embodiment to link potential V of the wafer W to residual charge amount Q by calculating capacitance C from the physical structure of the wafer W and the electro-static chuck 22.

By referring to the equivalent circuit illustrated in FIG. 3A, the Kelvin method would be applied to the two electrodes (bipolar) that are the attracting electrode 23 and the upper electrode (i.e., gas showerhead 40) with the wafer W and the base 24 intervening therebetween, thereby measuring a voltage between these two electrodes. The Kelvin method, however, is not able to measure the state of the wafer W and the attracting electrode 23 under the monopole condition In contrast, the measurement method of the present embodiment can directly measure the state of the wafer W and the attracting electrode 23. The breaking or flying of the wafer W are attributable to the residual adherence of the wafer W caused by a change in the surface condition of the electro-static chuck 22. In order to prevent the breaking and flying of the wafer W, the measurement method of the present embodiment calculates residual charge amount Q of the wafer W before the wafer W is disengaged from the electro-static chuck 22, followed by calculating electricity removal voltage V from calculated residual charge amount Q.

In the present embodiment, residual charge amount Q is calculated from the DC current, corresponding to the induced current, output from the phase sensitive detector 80, and, then, electricity removal voltage V is calculated from calculated residual charge amount Q. Electricity removal voltage V is then reversely applied during the electricity removal process, which allows the wafer W to be disengaged from the electro-static chuck 22 without causing the wafer W to be broken or sent flying. The term "reversely applied" refers to the application of voltage having a reversed polarity relative to the DC voltage HV that is applied during the plasma process to cause the electro-static chuck 22 to attract the wafer W.

As a general principle, residual charge amount Q is not measurable unless the wafer W is disengaged. The present embodiment utilizes the support pins 90 to vibrate the wafer W to bring about minute displacements. With this arrangement, C defined as Q=CV is fluctuated to bring about ΔCV, thereby allowing ΔQ to be derived. Here, C denotes the capacitance between the wafer W and the attracting electrode 23, and Q denotes the amount of residual charge of the wafer W, with V denoting the potential of the wafer. In so doing, the phase sensitive detection (i.e. lock-in detection by use of a lock-in amplifier) is performed to derive residual charge amount Q. The term "capacitance C between the wafer W and the attracting electrode 23" refers to the capacitance of the structure comprised of the wafer W, the gap between the wafer W and the attracting electrode 23, and the attracting electrode 23.

[Result of Calculating Residual Charge Amount]

Figure 4:
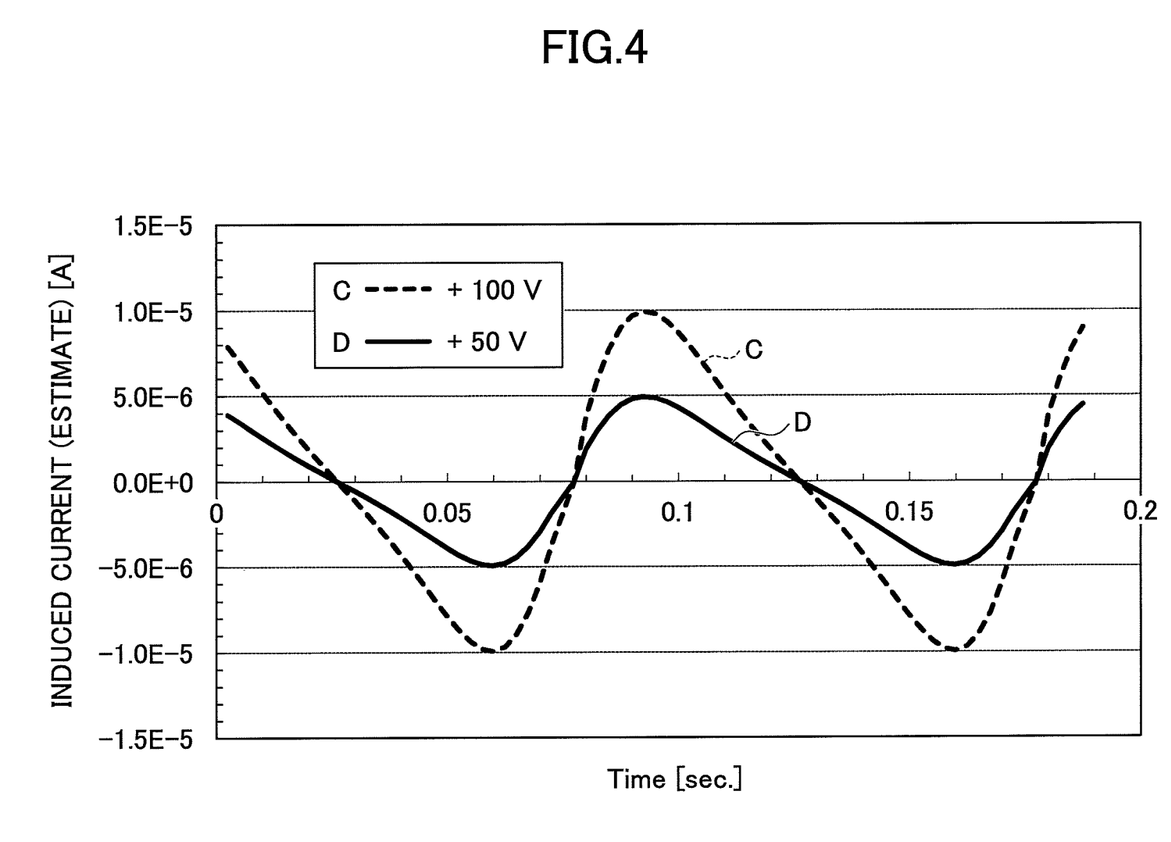
FIG. 4 is a graphic chart illustrating an example of the waveform of induced current flowing through an attracting electrode according to the embodiment.

FIG. 4 is a graphic chart illustrating an example of the waveform of induced current $i_3(t)$ according to the present embodiment. The calculation conditions are such that the potential of the wafer W is set to −300 V, the frequency of the reference signal set to 10 Hz, the amplitude of the reference signal set to 10 micrometers, and the offset of the reference signal set to 10 micrometers.

The potential of the wafer W refers to the potential difference, between the wafer W and the ground, which is unmeasurable in reality, and is set to −300 V in this case. In the case of the potential of the wafer W being around −300 V, the breaking or flying of the wafer W will not occur when disengaging the wafer W from the electro-static chuck 22. The offset of the amplitude of the reference signal refers to the midpoint of the wave of the reference signal.

In FIG. 4, changes in the induced current $i_3(t)$ are represented by a curve C when the residual charge of the wafer W is equivalent to 100 V, and are represented by a curve D when the residual charge of the wafer W is equivalent to 50 V. Whether the charge stored in the wafer W is positive or negative determines whether the induced current flows in a positive direction or a negative direction.

Figure 5:
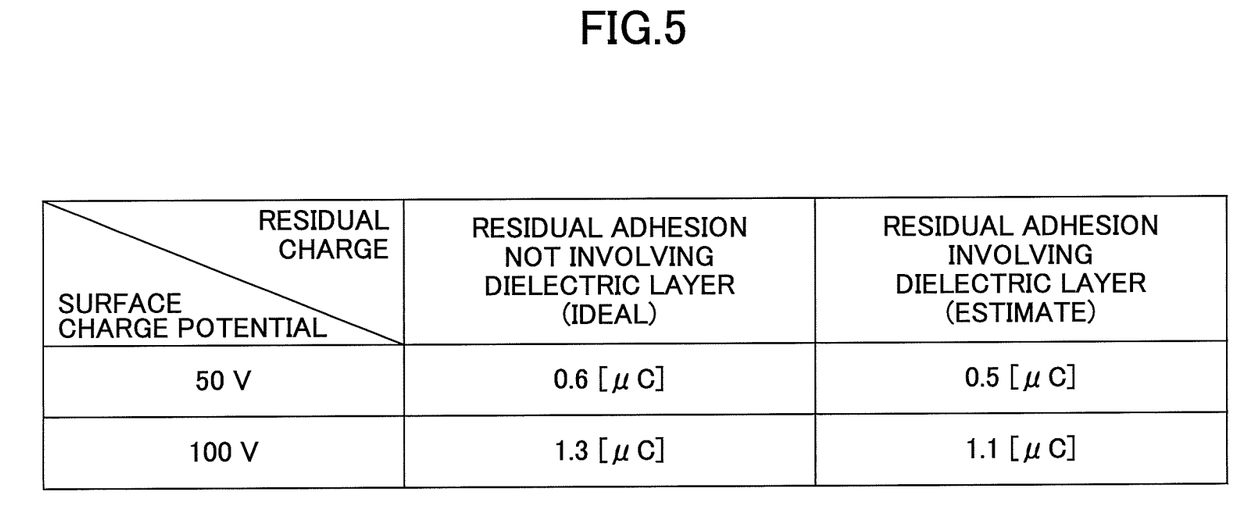
FIG. 5 is a drawing illustrating examples of calculation results derived by use of the induced current flowing through the attracting electrode.

FIG. 5 is a drawing illustrating an example of the results of calculating the residual charge amount of the wafer W in the case of the voltage V of the wafer W being 50 V or 100 V. These results are obtained by use of the induced current $i_3(t)$ through formulas (15), (16), and (17), which will be described later. Among the results of calculating the residual charge amount of the wafer W, the ideal value refers to the residual charge of the wafer W when residual adhesion occurs in the case of no dielectric layer being involved, and the predicted value refers to the residual charge of the wafer W when residual adhesion occurs in the case of a dielectric layer being involved.

Figure 6A:
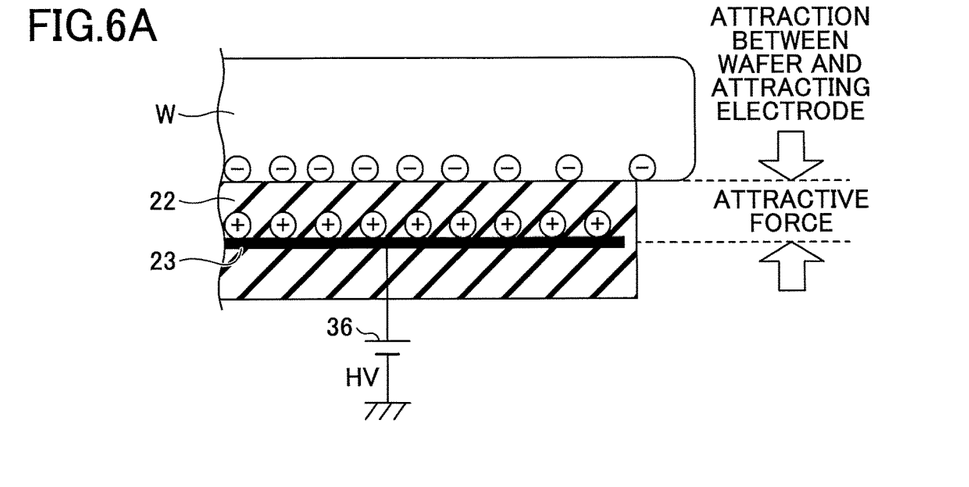
FIGS. 6A through 6C are drawings illustrating adhesion conditions according to the embodiment.

An ideal adhesion condition refers to the case in which an attractive force is generated between the wafer W and the attracting electrode 23 as illustrated in FIG. 6A. This attractive force is present as originally intended, and is irrelevant to problematic residual adhesion. Namely, the wafer W and the attracting electrode 23 are placed in a normal adhesion state, i.e., in an ideal adhesion state. An electro-static chuck 22 that is in new condition, without any deposited materials attached to the surface of the electro-static chuck 22, provides the ideal adhesion condition illustrated in FIG. 6A.

Figure 6B:
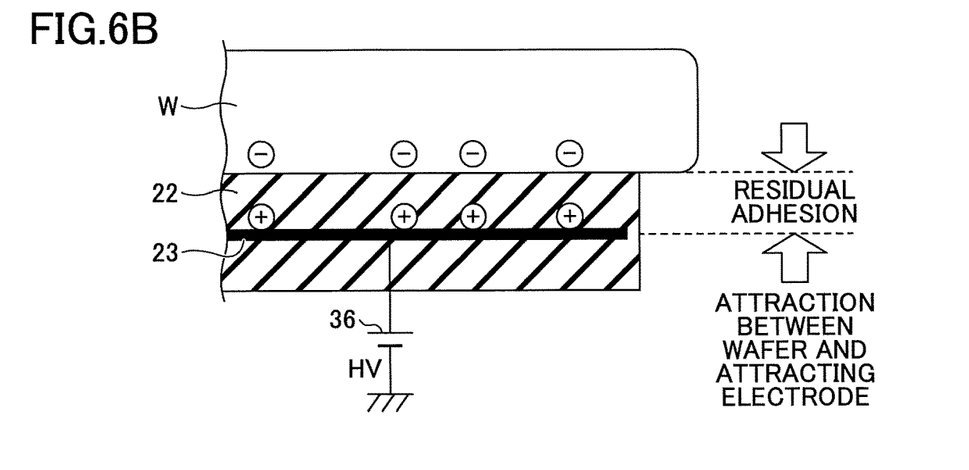

FIG. 6B illustrates the condition following after electricity removal is performed with respect to the ideal adhesion condition. In this case, electricity removal is performed by applying to the attracting electrode 23 the voltage having the same magnitude as, and the reversed polarity from, the voltage HV applied when causing the wafer W to adhere to the electro-static chuck 22.

In this case, a residual attractive force is present between the wafer W and the attracting electrode 23 due to the residual charge amount remaining in the wafer W. This condition is a normal residual adhesion condition, for which the residual charge of the wafer W prior to electricity removal is calculated as shown as the ideal value (residual adhesion involving no dielectric layer) in FIG. 5.

In this case, the residual charge amount Q (ideal value) of the wafer W is calculated as equal to 0.6 microcoulombs when the voltage of the wafer W is equivalent to 50 V, and is calculated as 1.3 microcoulombs when the voltage of the wafer W is equivalent to 100 V. These calculation results are derived by use of the induced current $i_3(t)$ of the attracting electrode 23 through the formulas (15), (16), and (17), which will be described later.

Figure 6C:
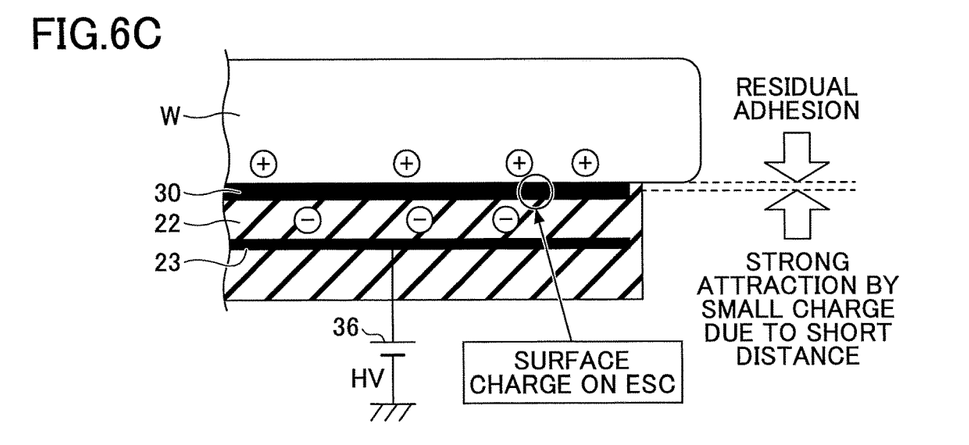

FIG. 6C illustrates the condition following after electricity removal in the case in which deposited materials are attached to the surface of the electro-static chuck 22 over long time of use of the electro-static chuck 22.

In the condition illustrated in FIG. 6C, a dielectric layer 30 that is a layer of deposited reaction materials exists on the surface of the electro-static chuck 22. Despite the removal of static electricity described above, residual charge stored in the dielectric layer 30 creates residual adhesion between the wafer W and the dielectric layer 30. This is a type of residual adhesion that causes the breakage of a wafer or the like, being identified as an abnormal residual adhesion condition. Since the distance between the wafer W and the dielectric layer 30 is notably short, a strong attractive force is generated between the wafer W and the electro-static chuck 22 even when the amount of residual charge in the dielectric layer 30 is small. Further, it is difficult to remove the residual charge of the dielectric layer because the charge is covered under the bottom surface of the wafer W.

Even in such a condition, an estimate of the residual charge amount of the wafer W existing prior to electricity removal can be calculated before the disengagement of the wafer W according to the present embodiment. The results of calculating the residual charge amount of the wafer W are the estimates (residual adhesion involving a dielectric layer) illustrated in FIG. 5.

In this case, the residual charge amount Q (estimate) of the wafer W is calculated as equal to 0.5 microcoulombs when the voltage of the wafer W is equivalent to 50 V, and is calculated as 1.1 microcoulombs when the voltage of the wafer W is equivalent to 100 V. These calculation results are derived by use of the induced current $i_3(t)$ of the attracting electrode 23 through the formulas (15), (16), and (17).

A difference between a calculated ideal value and a calculated estimate of the residual charge amount of the wafer W is equal to the amount of residual charge stored in the dielectric layer 30. As is understood from the results of calculation of ideal values and estimates illustrated in FIG. 5, an estimate that is close to a real value is successfully calculated with respect to the residual charge amount of the wafer W despite the complex structure of the electro-static chuck 22.

[Method of Calculating Residual Charge Amount]

In the following, a method of calculating residual charge amount will be described. In the case of the wafer W having electric charge, the movement of the wafer W causes induced current to flow through the upper electrode and the attracting electrode 23. The induced current flowing through the attracting electrode 23 is determined by the amount of charge of the wafer and the capacitance between the wafer and the ground potential. The capacitance between the wafer and the ground potential is determined by the structure of the electro-static chuck 22 and the structure of the processing container 10. Identifying the structure of the electro-static chuck 22 and the structure of the processing container 10 thus allows the capacitance between the wafer W and the ground potential to be calculated. The amount of charge of the wafer W is proportional to the induced current, with the proportionality coefficient being responsive to the capacitance between the wafer and the ground potential.

In the model illustrated in FIG. 3, the movement of the wafer W causes induced current to flow from the attracting electrode 23. An ammeter A measures the amount of such current. In the following, a formula expressing proportionality between the induced current $i_3(t)$ of the attracting electrode 23 and the residual charge amount Q of the wafer W will be derived. In each expression appearing in the following description, a variable having suffix "1" represents a value relating to the upper electrode, a variable having suffix "2" representing a value relating to the wafer, and a variable having suffix "3" representing a value relating to the electro-static chuck.

When representing the vertical movement of the wafer W as a function of time, a distance $h_2(t)$ by which the wafer W is raised by the support pins is represented by formula (1) as follows.

$$h_2(t) = A_0 + A_1 \sin(\omega t \varphi) \quad (1)$$

$A_1$ represents the amplitude, in the spatial dimension, of a reference signal for causing reciprocating movement of the pins (i.e., the amplitude of up-and-down movement of the pins). $A_0$ represents the offset (i.e., the midpoint of the wave) of the reference signal in the spatial dimension, and $\omega$ represents an angular frequency.

The distance $h_1(t)$ between the upper electrode and the wafer is represented by formula (2) as follows.

$$h_1(t) = H_{gap} - H_{wafer} - h_2(t) = B_0 - A_0 - A_1 \sin(\omega t - \varphi) \quad (2)$$

$H_{gap}$ is the distance between the surface of the upper electrode and the surface of the electro-static chuck. $H_{wafer}$ is the thickness of the wafer. $B_0$ is defined as $H_{gap} - H_{wafer}$.

In the case of the residual charge amount Q being not discharged, the amount of charge remains constant. Residual charge amount Q is represented by formula (3) as follows.

$$Q = c(t)v(t) = \text{const.} \quad (3)$$

Here, $c(t)$ is the capacitance between the wafer and the ground, and $v(t)$ is the voltage between the wafer and the ground.

Since electric charge is present only in the wafer, the voltage $v(t)$ between the wafer and the ground is represented by formula (4).

$$v(t) = v_1(t) = v_3(t) \quad (4)$$

Here, $v_1(t)$ is the voltage between the wafer and the upper electrode, and $v_3(t)$ is the voltage between the wafer and the attracting electrode.

The residual charge amount Q of the wafer is equal to the sum of charge $q_1(t)$ induced in the upper electrode and charge $q_3(t)$ induced in the attracting electrode. This relationship is expressed by formula (5).

$$Q = q_1(t) + q_3(t) = q_2(t) \quad (5)$$

In the above expression, $q_2(t)$ is the charge of the wafer.

Capacitance $c(t)$ between the wafer and the ground is represented by formula (6).

$$c(t) = (c_1(t)c_2(t) + c_2(t)C_3 + C_3 c_1(t))/(c_2(t) + C_3) \quad (6)$$

Here, $c_1(t)$ is the capacitance between the wafer and the upper electrode, and $c_2(t)$ is the capacitance between the wafer and the surface of the electro-static chuck. $C_3$ is the capacitance of the gap filled with a dielectric layer between the surface of the electro-static chuck and the attracting electrode.

From formula (3) and formula (6), voltage $v(t)$ between the wafer and the ground is expressed by formula (7) as follows.

$$v(t) = Q/c(t) = (c_2(t) + C_3)Q/(c_1(t)c_2(t) + c_2(t)C_3 + C_3 c_1(t)) \quad (7)$$

From formula (5) and formula (7), formula (8) is derived as follows.

$$Q = q_1(t) + q_3(t) = v(t)(c_1(t)c_2(t) + c_2(t)C_3 + C_3 c_1(t))/(c_2(t) + C_3) \quad (8)$$

The capacitances between the noted components are expressed by formulas (9) through (13).

$$c_1(t) = \varepsilon_0 \times S_{wafer}/h_1(t) \quad (9)$$

Here, $c_1(t)$ is the capacitance between the wafer and the upper electrode. Further, $\varepsilon_0$ is the relative permittivity of vacuum. $S_{wafer}$ is the area of the wafer surface, and $h_1(t)$ is the distance between the wafer and the upper electrode.

$$c_2(t) = \varepsilon_0 \times S_{wafer}/h_2(t) \quad (10)$$

In the above expression, $c_2(t)$ is the capacitance between the wafer and the surface of the electro-static chuck, and $h_2(t)$ is the distance between the wafer and the surface of the electro-static chuck.

$$C_3 = \varepsilon_{ESC} \times \varepsilon_0 \times S_{wafer}/h_{ESC} \quad (11)$$

$C_3$ is the capacitance of the gap filled with a dielectric material between the surface of the electro-static chuck and the attracting electrode. Further, $\varepsilon_0$ is the relative permittivity of the material of the electro-static chuck, and $h_{ESC}$ is the distance between the surface of the electro-static chuck and the attracting electrode.

$$c_{23}(t) = \varepsilon_{ESC} \times \varepsilon_0 \times S_{wafer}/(\varepsilon_{ESC} \times h_2(t) + h_{ESC}) \quad (12)$$

Here, $c_{23}(t)$ is the capacitance between the wafer and the attracting electrode, and $h_2(t)$ is the distance by which the wafer is raised.

$$c(t) = \varepsilon_0 \times S_{wafer}/h_1(t) + \varepsilon_{ESC} \times \varepsilon_0 \times S_{wafer}/(\varepsilon_{ESC} \times h_2(t) + h_{ESC}) \quad (13)$$

Here, $c(t)$ is the capacitance between the wafer and the ground.

By use of formulas (2), (7), and (9) to (11), formula (8) is modified into formula (14), which provides $q_3(t)$ that is electric charge induced on the attracting electrode.

$$q_3(t) = v(t) \times (c_1(t)c_2(t) + c_2(t)C_3 + C_3 c_1(t))/(c_2(t) + C_3) - q_1(t) = v(t) \times c_2(t)C_3/(c_2(t) + C_3) = c_2(t)C_3 Q/(c_1(t)c_2(t) + c_2(t)C_3 + C_3 c_1(t)) = Qh_1(t)/(\varepsilon_0 \times S_{wafer}/C_3 + h_1(t) + h_2(t)) = Qh_1(t)/(h_{ESC}/\varepsilon_{ESC} + h_1(t) + h_2(t)) = Q(B_0 - A_0 - A_1 \sin(\omega t - \varphi))/(h_{ESC}/\varepsilon_{ESC} + B_0) = Q(B_0 - A_0)/(h_{ESC}/\varepsilon_{ESC} + B_0) - QA_1 \times \sin(\omega t - \varphi)/(h_{ESC}/\varepsilon_{ESC} + B_0) = Q_0 - A \times \sin(\omega t \varphi) \quad (14)$$

Here, $Q_0 = Q(B_0 - A_0)/(h_{ESC}/\varepsilon_{ESC} + B_0)$, and $A = QA_1/(h_{ESC}/\varepsilon_{ESC} + B_0)$.

Formula (14), which represents $q_3(t)$ that is the electric charge induced in the attracting electrode, is differentiated to derive formula (15), which represents the induced current $i_3(t)$ of the attracting electrode.

$$i_3(t)=dq_3(t)/dt=d/dt(Q_0-A\sin(\omega t-\varphi))=-A\omega\cos(\omega t-\varphi) \quad (15)$$

As a result, a DC induced current $i_3$ of the attracting electrode is represented by formula (16).

$$I_3=A\omega=QA_1\omega/(h_{ESC}/\varepsilon_{ESC}+B_0) \quad (16)$$

The induced current $i_3(t)$ of the attracting electrode is applied to the phase sensitive detector 80, which then outputs the DC induced current $i_3$. The control unit 100 calculates the residual charge amount Q of the wafer W from the DC induced current $i_3$ output from the phase sensitive detector 80 by use of formula (17).

$$Q=[(h_{ESC}/\varepsilon_{ESC}+B_0/A_1\omega)]\times I_3 \quad (17)$$

The control unit 100 inserts the calculated value of residual charge amount Q into V=C/Q to obtain the electricity removal voltage V that is to be reversely applied.

As described heretofore, the measurement method of the present embodiment vibrates the wafer W before disengaging the wafer W so as to cause induced current to flow through the attracting electrode 23, followed by calculating the residual charge amount Q of the wafer W corresponding to the induced current flowing through the attracting electrode 23, and then using the calculated residual charge amount Q of the wafer W to calculate the electricity removal voltage V that is to be applied for electricity removal. In the electricity removal process, the calculated electricity removal voltage V is reversely applied. This enables the smooth disengagement of the wafer W.

[Method of Removing Electricity]

Figure 7:
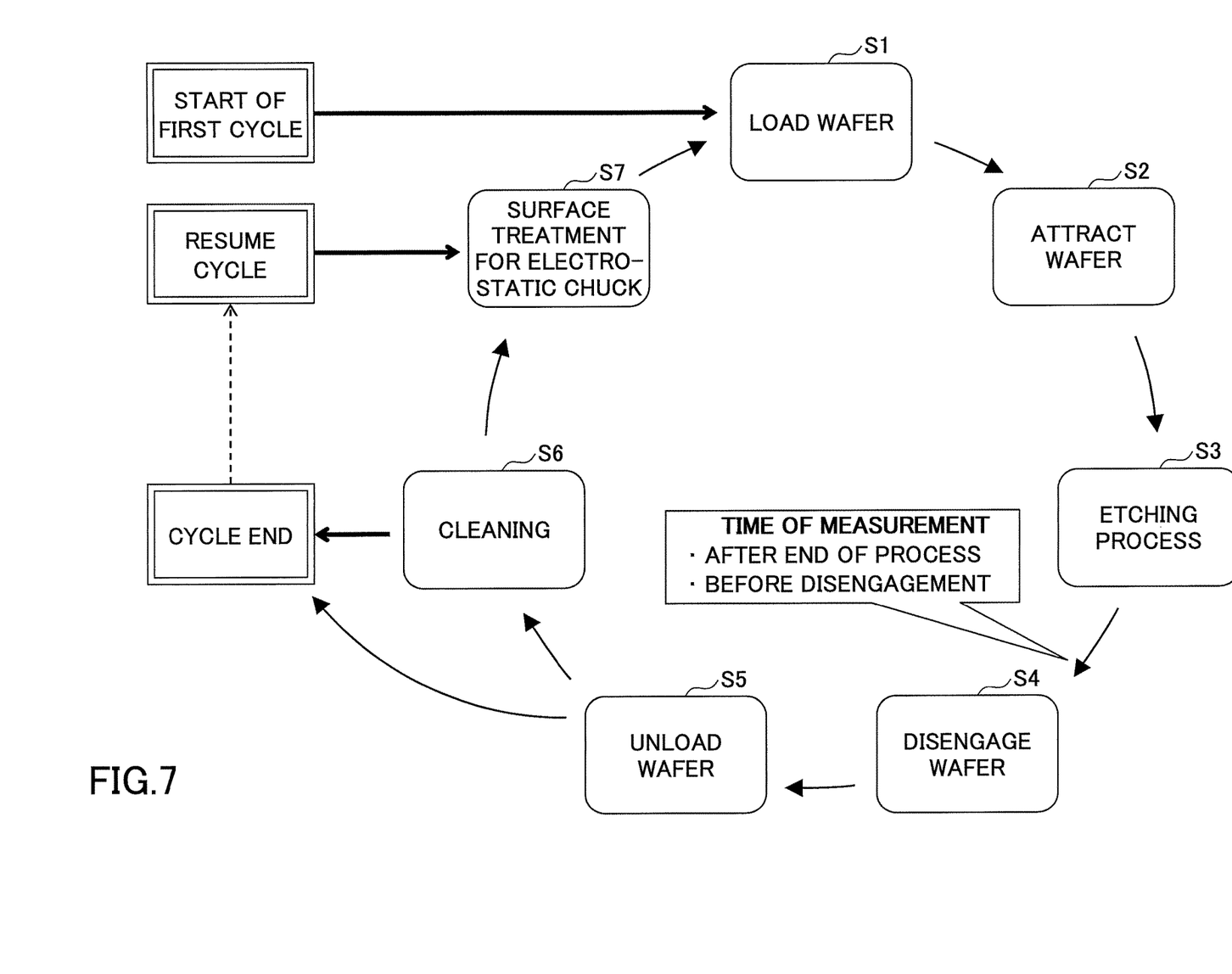
FIG. 7 is a drawing illustrating the time of measuring residual charge according to the embodiment.
Figure 8:
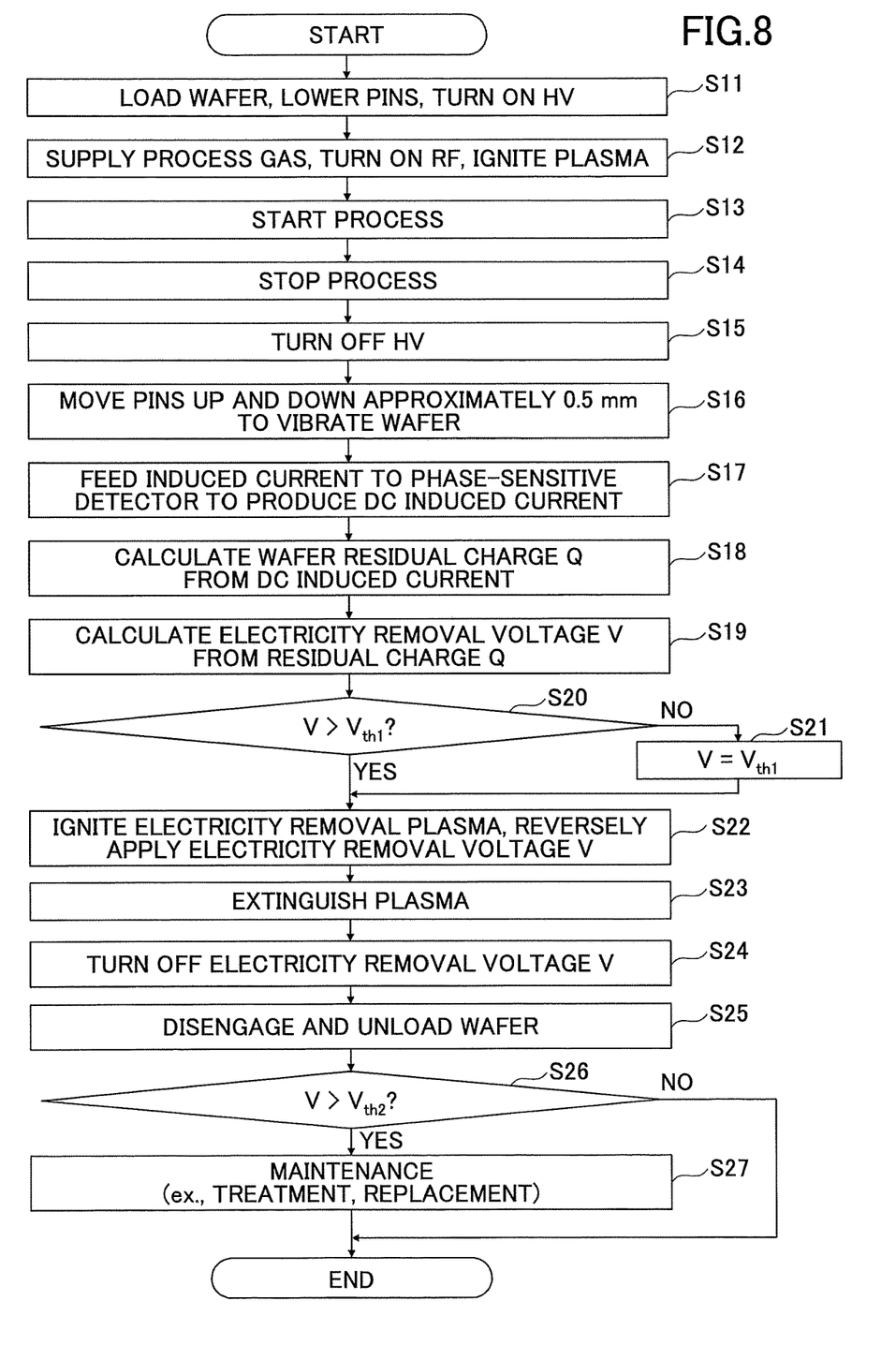
FIG. 8 is a flowchart illustrating an example of the measurement of residual charge and the removal of static electricity according to the embodiment.

In the following, the method of removing static electricity by use of the calculated electricity removal voltage V according to the present embodiment will be described with reference to FIG. 7 and FIG. 8. FIG. 7 is a drawing illustrating the time of measuring residual charge amount according to the present embodiment. FIG. 8 is a flowchart illustrating an example of the measurement of residual charge amount and the removal of static electricity according to the present embodiment.

Figure 1:
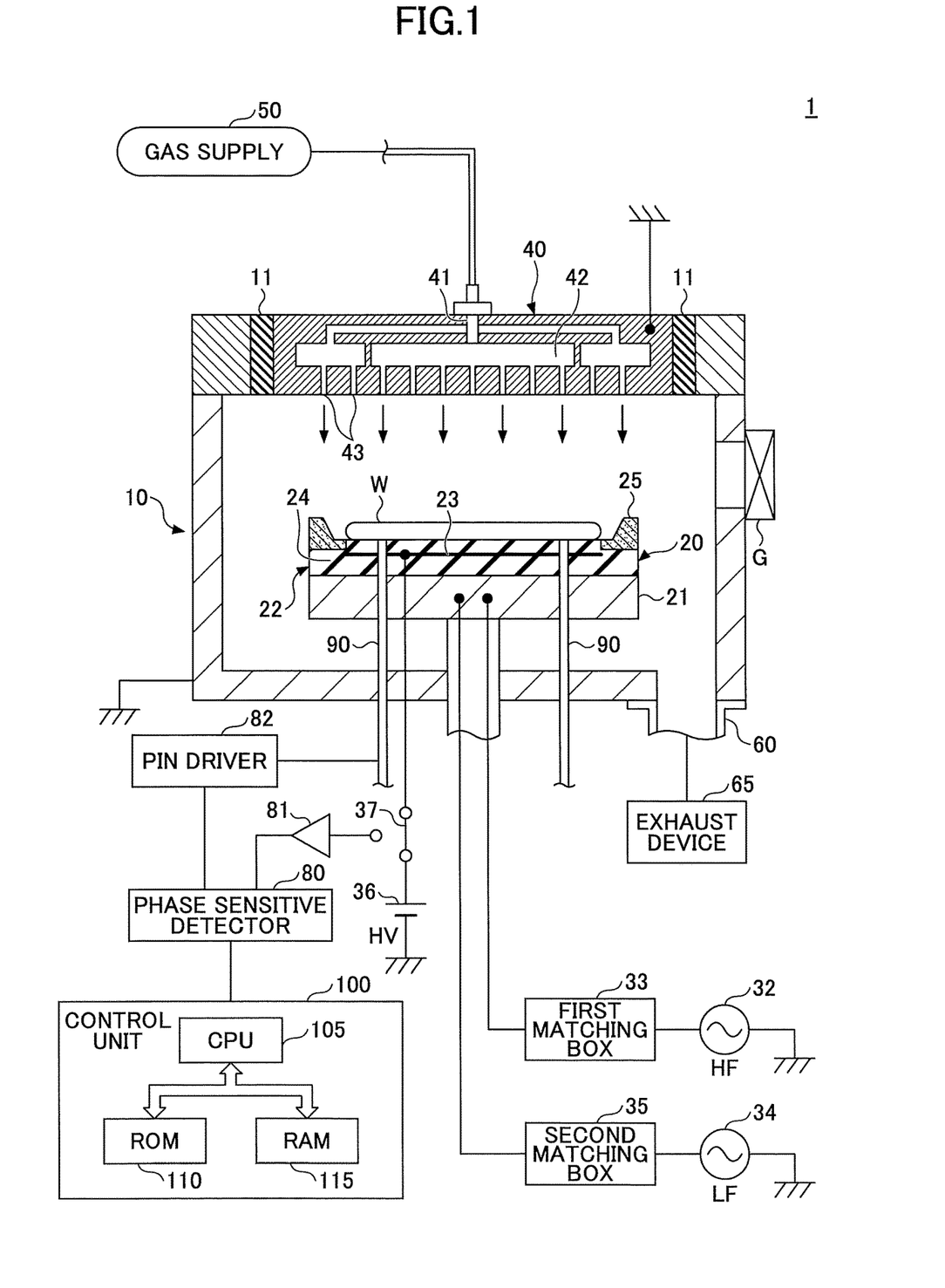
FIG. 1 is a drawing illustrating an example of a plasma processing apparatus according to an embodiment.

As illustrated in FIG. 7, the wafer W is loaded to the plasma processing apparatus 1 in the process cycle for processing the wafer W in the plasma processing apparatus 1 illustrated in FIG. 1 (step S1). The DC power supply 36 then applies a predetermined DC voltage HV to the attracting electrode 23 to cause the wafer W to be electrostatically adhered to the electro-static chuck 22 (step S2). Power with first high frequency and power with second high frequency are applied to the stage 20 to turn a process gas supplied from the gas supply 50 into plasma, thereby performing a plasma process such as etching with respect to the wafer W (step S3).

The support pins 90 are then moved up and down to vibrate the wafer W, and the induced current $i_3(t)$ flowing through the attracting electrode 23 is measured at a measurement time during the vibrating movement. The residual charge amount Q is calculated from the induced current $i_3(t)$, followed by calculating the electricity removal voltage V from the residual charge amount Q. Namely, the measurement time for measuring the induced current $i_3(t)$ occurs after the completion of a plasma process for the wafer W and during the movement of the support pins 90 (before the disengagement of the wafer).

In the case of the calculated electricity removal voltage V being greater than a first predetermined threshold $V_{th1}$, the calculated electricity removal voltage V is applied (i.e., reversely applied) to the attracting electrode 23, followed by disengaging the wafer W from the electro-static chuck 22 (step S4) to unload the wafer W (step S5). The first threshold $V_{th1}$ is provided in advance for the purpose of determining whether to perform electricity removal using the calculated electricity removal voltage V during the electricity removal process. The value of the first threshold $V_{th1}$ may be set to the same magnitude as, and the reversed polarity from, the DC voltage HV applied in step S2. In the case of the calculated electricity removal voltage V being smaller than or equal to the first threshold $V_{th1}$, the voltage equal to the first threshold $V_{th1}$ may be applied to the attracting electrode during the electricity removal process.

In the case of the calculated electricity removal voltage V being greater than a second threshold $V_{th2}$, cleaning is performed with respect to the processing container and the like. The second threshold $V_{th2}$ is provided in advance to determine whether to perform cleaning with respect to the processing container and the like. In the case of the calculated electricity removal voltage V being smaller than or equal to the second threshold $V_{th2}$, cleaning may not be performed.

With this, one processing cycle for a wafer W comes to an end. A processing cycle for a next wafer W then starts. In the next processing cycle, surface treatment is performed with respect to the electro-static chuck 22 (step S7), followed by loading a next wafer W (step S1) and performing the processes of the steps following step S1.

In the following, a description in further detail will be given by referring to FIG. 8 with respect to measurement and electricity removal by use of the induced current $i_3(t)$ measured for each wafer as described above. The processes of FIG. 8 are mainly controlled by the control unit 100.

Upon the start of processes illustrated in FIG. 8, the control unit 100 controls the loading of the wafer W, the lowering of the support pins 90, and the application of the DC voltage HV to the attracting electrode 23 (step S11). The control unit 100 then supplies process gases, and turns on the first high frequency power and the second high frequency power to ignite plasma (step S12).

The control unit 100 then starts a plasma process with respect to the wafer W (step S13), followed by allowing the plasma process to come to an end upon the passage of a predetermined process time (step S14). Subsequently, the control unit 100 turns off the DC voltage HV applied to the attracting electrode 23 (step S15). Reverse application of the DC voltage HV may optionally be performed at this time.

The control unit 100 moves the support pins 90 up and down a distance of approximately 0.5 mm to vibrate the wafer W (step S16). In response, the induced current $i_3(t)$ is generated through the attracting electrode 23. The control unit 100 feeds the induced current $i_3(t)$ to the phase sensitive detector 80, thereby causing the phase sensitive detector 80 to output the induced current $i_3$ (step S17).

The control unit 100 then calculates the residual charge amount Q of the wafer W from the induced current $I_3$ by use of formula (17). The control unit 100 calculates, from the calculated residual charge amount Q, the electricity removal voltage V that is to be reversely applied (step S19).

Subsequently, the control unit 100 determines whether the calculated electricity removal voltage V is greater than the first threshold $V_{th1}$ (step S20). Upon determining that the calculated electricity removal voltage V is greater than the first threshold $V_{th1}$, the control unit 100 ignites plasma for electricity removal, thereby reversely applying the calculated electricity removal voltage V to the attracting electrode 23 (step S22). In the case of determining that the calculated electricity removal voltage V is smaller than or equal to the first threshold $V_{th1}$, the control unit 100 sets the electricity removal voltage V to the first threshold $V_{th1}$ (step S21), followed by igniting plasma for electricity removal, thereby reversely applying the electricity removal voltage V to the attracting electrode 23 (step S22).

The control unit 100 then turns off the first high frequency power, stops supplying inactive gasses, and extinguishes plasma (step S23). Subsequently, the control unit 100 turns off the electricity removal voltage V reversely applied to the attracting electrode 23 (step S24). The control unit 100 then disengages the wafer W, followed by unloading the wafer W (step S25).

After the unloading of the wafer W, the control unit 100 determines whether the calculated electricity removal voltage V is greater than the second threshold $V_{th2}$ (step S26). In the case of determining that the calculated electricity removal voltage V is greater than the second threshold $V_{th2}$, the control unit 100 performs maintenance such as performing treatment on the electro-static chuck 22 or exchanging the electro-static chuck 22 with a new, unused one (step S27), followed by bringing the procedure to an end. In the case of determining that the calculated electricity removal voltage V is smaller than or equal to the second threshold $V_{th2}$, the control unit 100 brings the procedure to an end without performing maintenance.

As described above, the method of removing static electricity according to the present embodiment measures induced current flowing through the attracting electrode 23 upon vibrating the wafer W before the disengagement of the wafer W. This allows the residual charge amount Q of the wafer W to be calculated based on the measured induced current. This further allows the electricity removal voltage V to be derived from the calculated residual charge mount Q. Consequently, electricity removal by use of the derived electricity removal voltage V enables the disengagement of the wafer W from the electro-static chuck 22 without causing the wafer W to be broken or sent flying.

The method of removing static electricity according to the present embodiment ignites plasma for electricity removal, and then extinguishes the plasma after applying the derived electricity removal voltage V. With this arrangement, applying the derived electricity removal voltage V creates an electric field responsive to the applied electricity removal voltage V. Upon the extinguishment of plasma, the wafer W has charge stored therein in such an amount as to cancel this electric field. In this state, the electricity removal voltage V is turned off, resulting in the removal of charge stored in the wafer W. This substantially removes the residual charge of the wafer W.

The method of removing static electricity according to the present embodiment monitors the induced current $i_3(t)$ for each wafer W being processed, followed by making, based on the monitored value, a real-time decision as to whether the removal of static electricity using the electricity removal voltage V calculated according to the present embodiment is performed.

Electricity removal according to the present embodiment is not limited to such a real-time procedure. Since a time-dependent change of the dielectric layer 30 on the surface of the electro-static chuck 22 is slow, there is no need to monitor the induced current $i_3(t)$ for each wafer W being processed as in the present embodiment. For example, the induced current $i_3(t)$ may be monitored as illustrated in FIG. 7 only after processing a predetermined number of wafers W, at constant intervals, or at irregular intervals. The electricity removal voltage V calculated in response to the monitored results may be stored in the RAM 115. The method of removing static electricity according to the present embodiment may be performed such that the same electricity removal voltage V stored in the RAM 115 is reversely applied to the attracting electrode 23 with respect to a predetermined number of wafers W being processed.

[Frequency Dependency of Capacitance]

Figure 9:
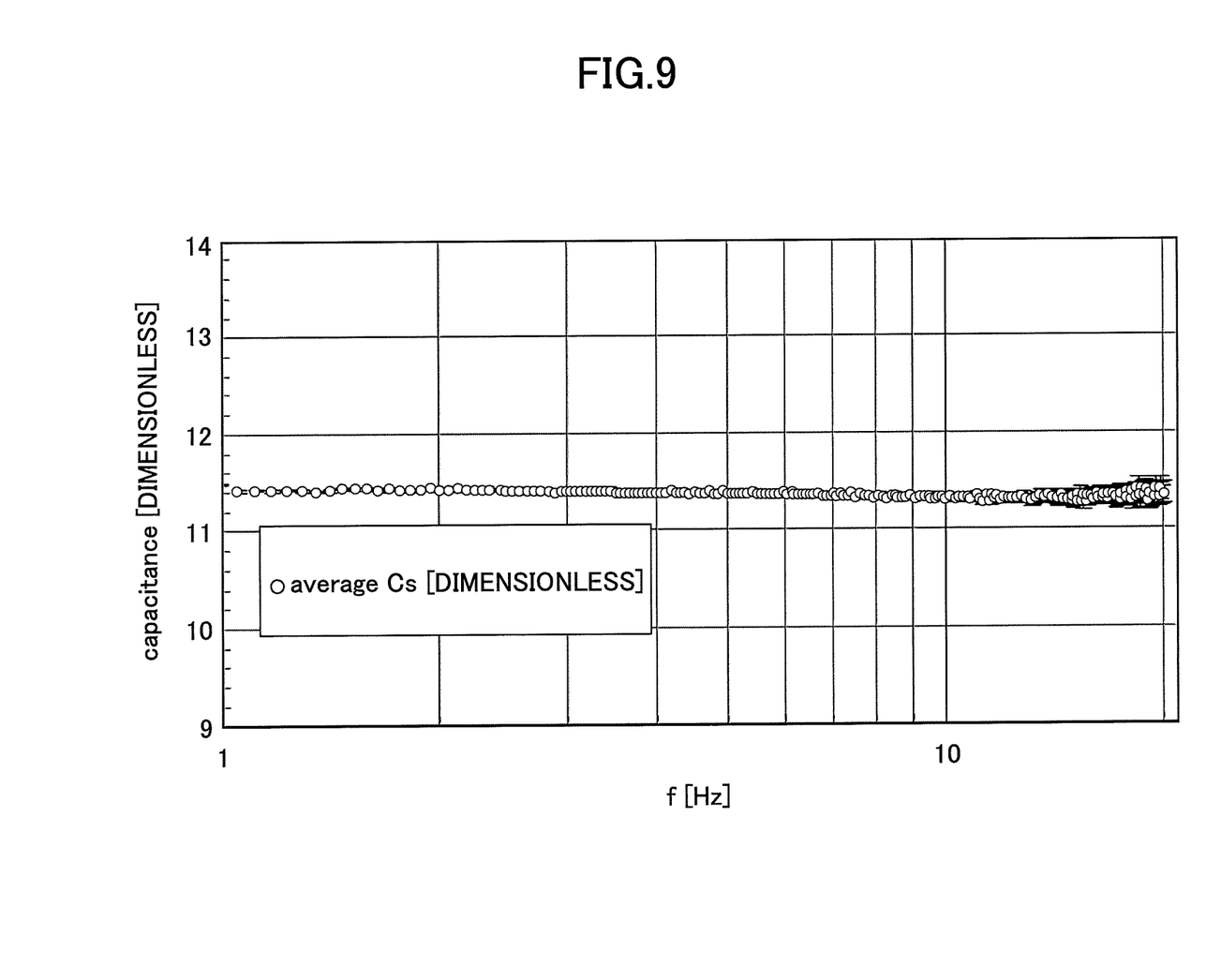
FIG. 9 is a drawing illustrating an example of the results of measuring capacitance with respect to an adhered wafer in the case of an electro-static chuck being in new condition.
Figure 10:
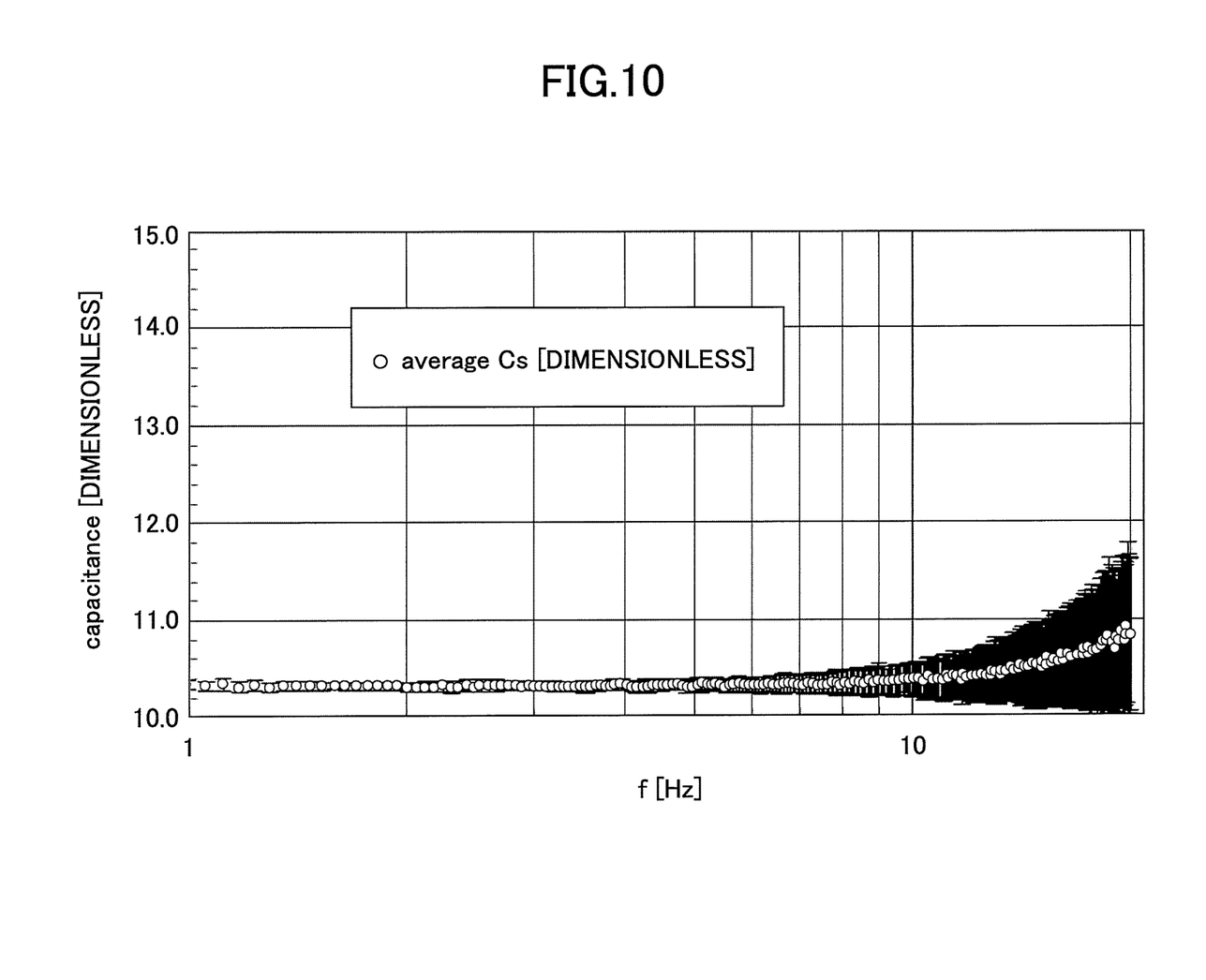
FIG. 10 is a drawing illustrating an example of the results of measuring capacitance with respect to an adhered wafer in the case of an electro-static chuck being in used condition.

In the following, the frequency dependency of capacitance will be described with reference to FIG. 9 and FIG. 10. FIG. 9 is a drawing illustrating the frequency dependency of capacitance between an attracting electrode and a wafer attracted thereto in the case in which the electro-static chuck of the present embodiment is in new condition. FIG. 10 is a drawing illustrating the frequency dependency of capacitance between an attracting electrode and a wafer attracted thereto in the case in which the electro-static chuck of the present embodiment is in used condition. The vertical axis is normalized and dimensionless for the purpose of showing only the tendency of frequency dependency of capacitance.

In the case of the electro-static chuck 22 being in new condition, the capacitance C between the wafer and the attracting electrode exhibits variation when the frequency of a reference signal is higher than 10 Hz as illustrated in FIG. 9. This fact indicates that the capacitance C has frequency dependency when the electro-static chuck 22 is in new condition, and vibrating the wafer W at frequency higher than 10 Hz causes resonation, thereby failing to enable accurate calculation of the residual charge amount Q.

Even in the case of the electro-static chuck 22 being in used condition, the capacitance C between the wafer and the attracting electrode exhibits variation when the frequency of a reference signal is higher than 10 Hz as illustrated in FIG. 10. This fact indicates that the capacitance C has frequency dependency even when the electro-static chuck 22 is in used condition, and vibrating the wafer W at frequency higher than 10 Hz causes resonation, thereby failing to enable accurate calculation of the residual charge amount Q.

According to the data illustrated in FIG. 9 and FIG. 10, the frequency of a reference signal is preferably lower than or equal to 10 Hz in order to enable accurate calculation of the residual charge amount Q. The frequency of the reference signal is preferably greater than or equal to 1 Hz. In FIG. 9 and FIG. 10, the average temperature of the electro-static chuck is 23 degrees Celsius.

Although a measurement method, a method of removing static electricity, and a plasma processing apparatus have heretofore been described with reference to the embodiments, the measurement method, the method of removing static electricity, and the plasma processing apparatus according to the present invention are not limited to such embodiments, and various modifications and improvements may be made without departing from the scope of the invention. Elements described in connection with these embodiments may be combined with each other as long as consistency is maintained.

The disclosed configuration is applicable not only to a two-frequency-applied parallel-plate apparatus illustrated in FIG. 1 but also to plasma processing apparatuses of different types. Plasma processing apparatuses of different types include a capacitively-coupled plasma apparatus, an inductively-coupled plasma processing apparatus, a plasma processing apparatus utilizing a radial-line slot antenna, a helicon wave plasma apparatus, an electron cyclotron resonance plasma apparatus, a surface-wave plasma processing apparatus, and the like.

The wafer W has been used as an example of the substrate subjected to etching in the present specification, but is only a non-limiting example. The substrate subjected to etching may be various types of substrates used for a LCD (liquid crystal display), an FPD (flat panel display), and the like, a photomask, a CD substrate, a printed circuit board, or the like.

The present application is based on and claims the benefit of priority of Japanese priority application No. 2016-251572 filed on Dec. 26, 2016, with the Japanese Patent Office, the entire contents of which are hereby incorporated by reference.

What is claimed is:

1. A measurement method, comprising:
vibrating a wafer through up-and-down movement of one or more pins supporting the wafer after performing processing with gas-based plasma generated through application of high-frequency electric power while the wafer, which is placed on a stage in a processing container, is electrostatically adhered by an electro-static chuck;
calculating a residual charge amount of the wafer from an induced current flowing through an attracting electrode upon the vibrating of the wafer, the induced current flowing without detaching the wafer from a surface of the electro-static chuck; and
calculating a voltage to be applied to the attracting electrode in response to the calculated residual charge amount of the wafer.

2. The measurement method as claimed in claim 1, wherein a frequency of a signal generated by vibrating the wafer through the up-and-down movement of the one or more pins is controlled to be smaller than or equal to 10 Hz.

3. The measurement method as claimed in claim 1, wherein an amplitude of the up-and-down movement is controlled to be smaller than or equal to 1 mm.

4. The measurement method as claimed in claim 1, wherein an amplitude of the up-and-down movement is controlled to be smaller than or equal to 0.5 mm.

5. A method of removing static electricity, comprising:
retrieving from a memory the voltage calculated by the measurement method of claim 1 and applying the calculated voltage to the attracting electrode after performing processing with gas-based plasma generated through application of high-frequency electric power while a wafer placed on the stage in the processing container is electrostatically adhered to the electro-static chuck;
stopping the application of high-frequency electric power after applying the calculated voltage to the attracting electrode; and
stopping the application of the calculated voltage to the attracting electrode after stopping the application of high-frequency electric power.

6. A method of removing static electricity, comprising:
vibrating a wafer through up-and-down movement of one or more pins supporting the wafer after performing processing with gas-based plasma generated through application of high-frequency electric power while the wafer, which is placed on a stage in a processing container, is electrostatically adhered by an electro-static chuck;
calculating a residual charge amount of the wafer from an induced current flowing through an attracting electrode upon the vibrating of the wafer, the induced current flowing without detaching the wafer from a surface of the electro-static chuck;
calculating a voltage to be applied to the attracting electrode in response to the calculated residual charge amount of the wafer;
applying the calculated voltage to the attracting electrode and then stopping the application of high-frequency electric power; and
stopping applying the calculated voltage to the attracting electrode after stopping the application of high-frequency electric power.

7. The method as claimed in claim 6, further comprising:
making a comparison between the calculated residual charge amount of the wafer and a first threshold; and
applying the calculated voltage to the attracting electrode upon determining based on the comparison that the calculated residual charge amount is greater than the first threshold.

8. The method as claimed in claim 7, further comprising:
making a second comparison between the calculated residual charge amount with a second threshold greater than the first threshold; and
performing treatment on, or replacing, the electro-static chuck upon determining based on the second comparison that the calculated residual charge amount is greater than the second threshold.

9. The method as claimed in claim 6, wherein the attracting electrode is a monopole electrode.

10. A plasma processing apparatus for processing a wafer with gas-based plasma generated through application of high-frequency electric power while the wafer, which is placed on a stage in a processing container, is electrostatically adhered by an electro-static chuck, comprising:
a control unit configured to control the plasma processing apparatus,
wherein the control unit is configured
to vibrate the wafer through up-and-down movement of one or more pins supporting the wafer after performing processing with the plasma,
to calculate a residual charge amount of the wafer from an induced current flowing through an attracting electrode upon the vibrating of the wafer, the induced current flowing without detaching the wafer from a surface of the electro-static chuck, and
to calculate a voltage to be applied to the attracting electrode in response to the calculated residual charge amount of the wafer.

* * * * *